United States Patent
Kang et al.

(10) Patent No.: US 9,599,867 B2
(45) Date of Patent: Mar. 21, 2017

(54) DISPLAY SUBSTRATE AND METHOD OF MANUFACTURING THE SAME

(71) Applicant: SAMSUNG DISPLAY CO., LTD., Yongin, Gyeonggi-Do (KR)

(72) Inventors: Jang-Mi Kang, Bucheon-si (KR); Mee-Hye Jung, Suwon-si (KR); In-Jae Hwang, Suwon-si (KR); Sung-Hwan Kim, Yongin-si (KR); Il-Gon Kim, Seoul (KR); Sang-Uk Lim, Yongin-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 34 days.

(21) Appl. No.: 14/559,565

(22) Filed: Dec. 3, 2014

(65) Prior Publication Data

US 2015/0331266 A1 Nov. 19, 2015

(30) Foreign Application Priority Data

May 15, 2014 (KR) ........................ 10-2014-0058094

(51) Int. Cl.
| | |
|---|---|
| *H01L 27/12* | (2006.01) |
| *G02F 1/1362* | (2006.01) |
| *H01L 29/786* | (2006.01) |
| *H01L 29/66* | (2006.01) |
| *G02F 1/1343* | (2006.01) |

(52) U.S. Cl.
CPC ........ *G02F 1/13624* (2013.01); *H01L 27/124* (2013.01); *H01L 27/1248* (2013.01); *H01L 27/1259* (2013.01); *H01L 29/66765* (2013.01); *H01L 29/66969* (2013.01); *H01L 29/78669* (2013.01); *H01L 29/78693* (2013.01); *G02F 2001/134345* (2013.01); *G02F 2001/136218* (2013.01)

(58) Field of Classification Search
None
See application file for complete search history.

(56) References Cited

U.S. PATENT DOCUMENTS

| | | | |
|---|---|---|---|
| 7,511,789 | B2 | 3/2009 | Inoue et al. |
| 8,094,277 | B2 | 1/2012 | Tasaka et al. |
| 8,564,745 | B2 | 10/2013 | Kim |
| 8,587,752 | B2 | 11/2013 | Nishida et al. |

(Continued)

FOREIGN PATENT DOCUMENTS

| | | |
|---|---|---|
| KR | 10-2004-0001621 | 1/2004 |
| KR | 10-2005-0060730 | 6/2005 |

(Continued)

*Primary Examiner* — Ali Naraghi
(74) *Attorney, Agent, or Firm* — F. Chau & Associates, LLC

(57) ABSTRACT

A display substrate includes a first switching element electrically connected to a gate line and that extends in a first direction and electrically connected to a data line that extends in a second direction crossing the first direction, an insulation layer disposed on the first switching element, a shielding electrode disposed on the insulation layer and a pixel electrode that partially overlap the shielding electrode. The shielding electrode includes a first portion that overlaps the data line and extends in the second direction and a second portion that overlaps the gate line and extends in the first direction.

9 Claims, 13 Drawing Sheets

(56) References Cited

U.S. PATENT DOCUMENTS

| | | | |
|---|---|---|---|
| 2005/0110930 A1* | 5/2005 | Kim | G02F 1/134363 |
| | | | 349/141 |
| 2012/0205651 A1* | 8/2012 | Lee | H01L 27/1225 |
| | | | 257/43 |
| 2013/0155353 A1 | 6/2013 | Ma et al. | |
| 2013/0248866 A1* | 9/2013 | Lee | H01L 27/1225 |
| | | | 257/57 |

FOREIGN PATENT DOCUMENTS

| KR | 10-2007-0065465 | 6/2007 |
| KR | 10-2008-0065578 | 7/2008 |

* cited by examiner

DISPLAY SUBSTRATE AND METHOD OF MANUFACTURING THE SAME

PRIORITY STATEMENT

This application claims priority under 35 U.S.C. §119 from Korean Patent Application No. 10-2014-0058094, filed on May 15, 2014 in the Korean Intellectual Property Office KIPO, and all the benefits accruing therefrom, the contents of which are herein incorporated by reference in their entirety.

BACKGROUND

1. Technical Field

Embodiments of the present inventive concept are directed to a display substrate and method of manufacturing the display substrate. More particularly, embodiments of the present inventive concept are directed to a display substrate for a liquid crystal display and method of manufacturing the display substrate.

2. Discussion of the Related Art

Recently, a liquid crystal display apparatus having light weight and small size has been manufactured. A cathode ray tube (CRT) display apparatus has been used in the past due to performance and a competitive price. However a CRT display apparatus is relatively large and not very portable. Therefore, liquid crystal display apparatuses have become popular due to their small size, light weight and low-power-consumption.

In general, a liquid crystal display (LCD) panel includes a thin film transistor (TFT) substrate, an opposing substrate and an LC layer. The TFT substrate includes a plurality of gate lines, a plurality of data lines crossing the gate lines, a plurality of TFTs connected with the gate lines and data lines, and a plurality of pixel electrodes connected with the TFTs. The TFT includes a gate electrode extending from the gate line, a source electrode extending to the data line, and a drain electrode spaced apart from the source electrode.

In the liquid crystal display, the pixel electrode overlaps with a data line or is adjacent to a data line to increase an aperture ratio. Thus, a parasitic capacitance may be generated between the pixel electrode and the data line.

A shielding electrode that blocks an electric field may be used to eliminate various effects caused by the parasitic capacitance. However, when a shielding electrode is formed, an additional mask is used. Thus, a manufacturing cost may be increased.

SUMMARY

Exemplary embodiments of the present inventive concept may provide a display substrate capable of improved visibility without additional manufacturing processes.

Exemplary embodiments of the present inventive concept may further provide a method of manufacturing the display substrate.

According to an exemplary embodiment of the present inventive concept, there is provided a display substrate that includes a first switching element electrically connected to a gate line that extends in a first direction and a data line that extends in a second direction crossing the first direction, an insulation layer disposed on the first switching element, a shielding electrode disposed on the insulation layer and a pixel electrode that partially overlaps the shielding electrode. The shielding electrode includes a first portion that overlaps the data line and extends in the second direction and a second portion that overlaps the gate line and extends in the first direction.

In an exemplary embodiment, the shielding electrode may include a transparent conductive material.

In an exemplary embodiment, the display substrate may further include a first storage line disposed on the same layer as the gate line that extends in the first direction and a second storage line disposed on the same layer as the data line that extends in the second direction.

In an exemplary embodiment, the pixel electrode may include a first sub-pixel electrode, a second sub-pixel electrode disposed on the same layer as the shielding electrode and connected to the first switching element, and that overlaps an edge of the first sub-pixel electrode and an edge of the third sub-pixel electrode, and a third sub-pixel electrode that surrounds the first pixel electrode in a plan view.

In an exemplary embodiment, the display substrate may further include a second switching element electrically connected to the gate line, the data line and the third sub-pixel electrode and a third switching element electrically connected to the third sub-pixel electrode and the second storage line. The first switching element may be electrically connected to the first sub-pixel electrode and the second sub-pixel electrode In an exemplary embodiment, a source electrode and a drain electrode of the second switching element may extend in the first direction. An end portion of a drain electrode of the third switching element may extend in the first direction.

In an exemplary embodiment, the pixel electrode may include a high-pixel electrode and a low-pixel electrode spaced apart from the high-pixel electrode.

In an exemplary embodiment, the display substrate may further include a second switching element electrically connected to the gate line, the data line and the low-pixel electrode and a third switching element electrically connected to the gate line, the second storage line, and the low pixel electrode. The first switching element may be electrically connected to the high-pixel electrode.

In an exemplary embodiment, a source electrode and a drain electrode of the second switching element may extend in the first direction. An end portion of a drain electrode of the third switching element may extend in the first direction.

According to another exemplary embodiment of the present inventive concept, a method of manufacturing a display substrate includes forming a gate pattern, a channel layer, and a data pattern on a base substrate, forming an insulation layer on gate pattern, channel layer, and data pattern, forming an organic layer on the insulation layer, forming a shielding electrode on the organic layer that includes a first portion and a second portion, and forming pixel electrode that partially overlaps the shielding electrode.

In an exemplary embodiment, the gate pattern may include a first storage line, a gate line, a first gate electrode, a second gate electrode, and a third gate electrode. The data pattern may include a first drain electrode, a first source electrode, a second source electrode, a second drain electrode, a third source electrode, a third drain electrode, a first data line and a second data line. The channel layer may include a first channel portion, a second channel portion, and a third channel portion. The gate line may extend in a first direction and the data line may extend in a second direction crossing the first direction, the first portion of the shielding electrode may overlap the data line, and the second portion of the shielding electrode may overlap the gate line and may entirely overlap a region between pixel electrodes adjacent to each other in the second direction.

In an exemplary embodiment, the pixel electrode may include a first sub-pixel electrode, a second sub-pixel electrode disposed on the same layer as the shielding electrode and a third sub-pixel electrode that surrounds the first pixel electrode in a plan view. The first sub-pixel electrode may be connected to the second sub-pixel electrode, and the second sub-pixel may electrode overlap an edge of the first sub-pixel electrode and an edge of the third sub-pixel electrode.

In an exemplary embodiment, the first drain electrode may be electrically connected to the first sub-pixel electrode and the second sub-pixel electrode, the second drain electrode may be electrically connected to the second sub-pixel electrode, and the third drain electrode may be electrically connected to the third sub-pixel electrode.

In an exemplary embodiment, wherein the second source electrode and the second drain electrode may extend in the first direction. An end portion of the third drain electrode may extend in the first direction.

In an exemplary embodiment, the pixel electrode may include a high-pixel electrode and a low-pixel electrode spaced apart from the high-pixel electrode.

In an exemplary embodiment, the method may include forming the high-pixel electrode adjacent to the gate line in the second direction between the first data line and the second data line, wherein the high-pixel electrode is electrically to the first drain electrode, and forming the low-pixel electrode opposite to the high-pixel electrode with respect to the gate line between the first data line and the second data line, wherein the low-pixel electrode is electrically connected to the second drain electrode and the third drain electrode.

According to another exemplary embodiment of the present inventive concept, a display substrate includes a first switching element electrically connected to a gate line that extends in a first direction and a data line that extends in a second direction crossing the first direction, an insulation layer disposed on the first switching element, a shielding electrode disposed on the insulation layer, and a pixel electrode that partially overlaps the shielding electrode. The pixel electrode includes a first sub-pixel electrode, a second sub-pixel electrode disposed on the same layer as the shielding electrode and connected to the first switching element, and a third sub-pixel electrode that surrounds the first pixel electrode in a plan view.

In an exemplary embodiment, the display substrate may further include a first storage line disposed on the same layer as the gate line that extends in the first direction, and a second storage line disposed on the same layer as the data line that extends in the second direction.

In an exemplary embodiment, the first switching element may include a first drain electrode that includes an electrode portion that overlaps the gate line, and a contact portion that overlaps the first storage line, and the first storage line may include a stem portion and a protruding portion that protrudes in the second direction to overlap the contact portion of the first drain electrode. The contact portion and the protruding portion may have a substantially same area.

In an exemplary embodiment, the second sub-pixel electrode may overlap an edge of the first sub-pixel electrode and an edge of the third sub-pixel electrode, and the shielding electrode may include a first portion that overlaps the data line and extends in the second direction, and a second portion that overlaps the gate line and extends in the first direction.

According to a present exemplary embodiment, a shielding electrode is entirely formed on a light-blocking region, so that a black matrix may be omitted in a display substrate. Therefore, a mask for forming the black matrix may be omitted, so that a manufacturing cost may be decreased.

DETAILED DESCRIPTION OF EXEMPLARY EMBODIMENTS

Hereinafter, exemplary embodiments of the present inventive concept will be explained in detail with reference to the accompanying drawings.

Figure 1:
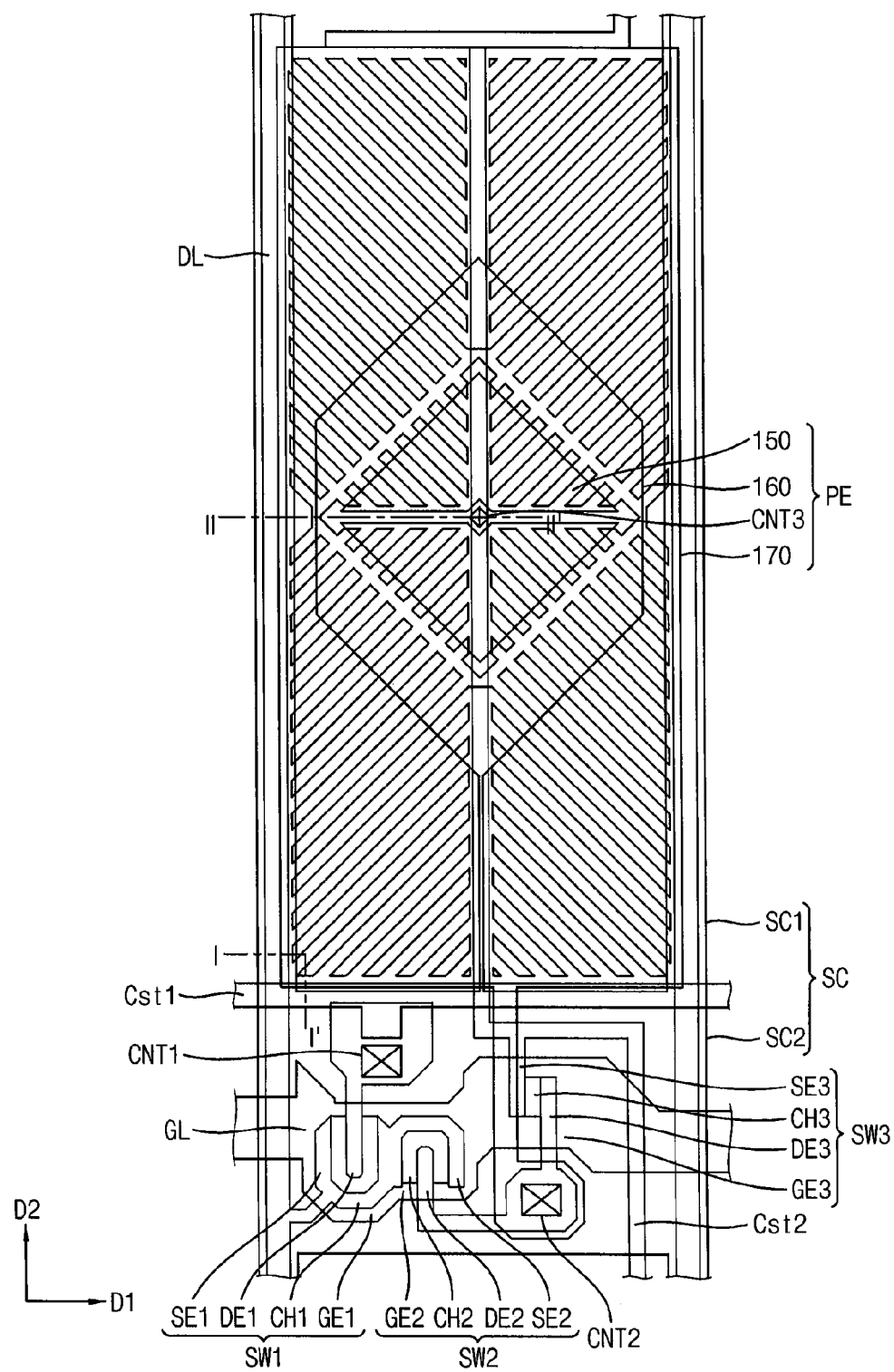
FIG. 1 is a plan view of a display substrate according to an exemplary embodiment of the inventive concept.
Figure 2:
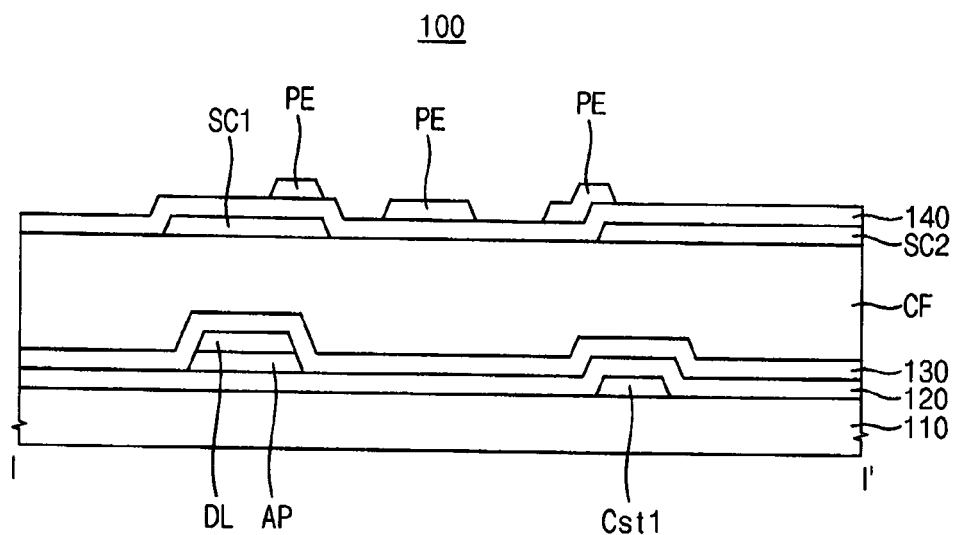
FIG. 2 is a cross-sectional view taken along a line I-I' of FIG. 1.
Figure 3:
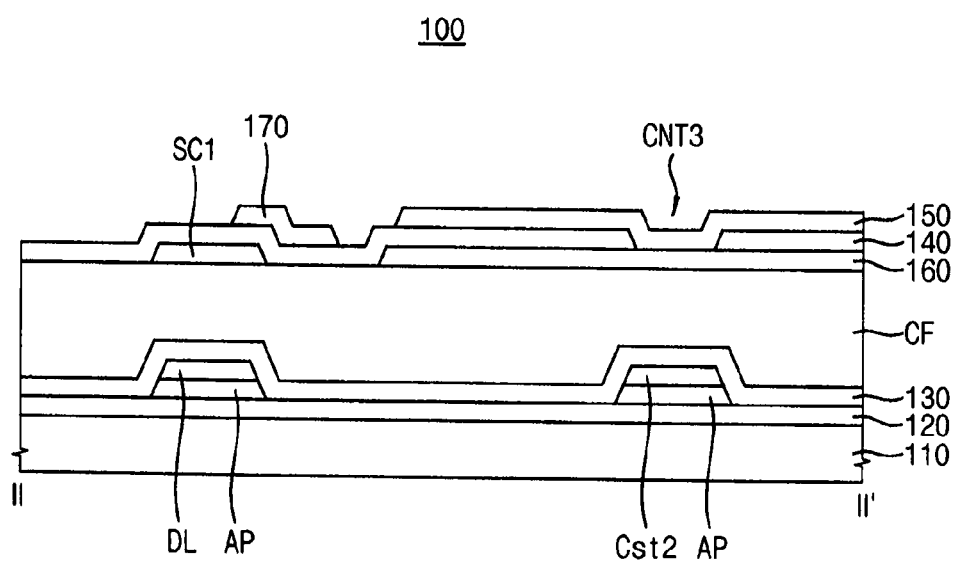
FIG. 3 is a cross-sectional view taken along a line II-II' of FIG. 1.

FIG. 1 is a plan view of a display substrate according to an exemplary embodiment of the inventive concept. FIG. 2 is a cross-sectional view taken along a line I-I' of FIG. 1. FIG. 3 is a cross-sectional view taken along a line II-II' of FIG. 1.

Referring to FIGS. 1 to 3, a display substrate 100 includes a gate line GL, a data line DL, a first storage line Cst1, a second storage line Cst2, a first switching element SW1, a second switching element SW2, a third switching element SW3, a shielding electrode SC, and a pixel electrode PE. The pixel electrode PE may include a first sub-pixel electrode 150, a second sub-pixel electrode 160 and a third sub-pixel electrode 170.

The gate line GL extends in a first direction D1. The gate line GL may have a single layer structure that may include copper (Cu), silver (Ag), chrome (Cr), molybdenum (Mo), aluminum (Al), titanium (Ti), manganese (Mn) or a mixture thereof. Alternatively, the gate line GL may have a multi layer structure with a plurality of layers that include different materials. For example, the gate line GL may include a copper layer and a titanium layer disposed on and/or under the copper layer. The gate line GL is electrically connected to a first gate electrode GE1 of the first switching element SW1, a second gate electrode GE2 of the second switching element SW2, and a third gate electrode GE3 of the third switching element SW3. In addition, portions of the gate line GL may form the first gate electrode GE1, the second gate electrode GE2, and the third gate electrode GE3.

The first storage line Cst1 may be formed from the same layer as the gate line GL. Thus, the first storage line Cst1 may be disposed on the same layer as the gate line GL. The first storage line Cst1 may have a single layer structure that may include copper (Cu), silver (Ag), chrome (Cr), molybdenum (Mo), aluminum (Al), titanium (Ti), manganese (Mn) or a mixture thereof. Alternatively, the first storage line Cst1 may have a multi layer structure with a plurality of layers that include different materials. For example, the first storage line Cst1 may include a copper layer and a titanium layer disposed on and/or under the copper layer.

A first insulation layer 120 is formed on the gate line GL and the first storage line Cst1. The first insulation layer 120 may include an inorganic material such as silicon oxide (SiOx) and/or silicon nitride (SiNx). For example, the first insulation layer 120 may include silicon oxide (SiOx), and may have thickness of about 500 Å. In addition, the first insulation layer 120 may include a plurality of layers that include different materials.

The data line DL is formed on the first insulation layer 120. The data line DL extends in a second direction D2 substantially perpendicular to the first direction D1. The data line DL may have a single layer structure that may include copper (Cu), silver (Ag), chrome (Cr), molybdenum (Mo), aluminum (Al), titanium (Ti), manganese (Mn) or a mixture thereof. Alternatively, the data line DL may have a multi layer structure with a plurality of layers that include different materials. For example, the data line DL may include a copper layer and a titanium layer disposed on and/or under the copper layer. The data line DL is electrically connected to a first source electrode SE1 of the first switching element SW1, and a second source electrode SE2 of the second switching element SW2.

The second storage line Cst2 may be formed from the same layer as the data line DL. Thus, the second storage line Cst2 may be disposed on the same layer as the data line DL. The second storage line Cst2 may have a single layer structure that may include copper (Cu), silver (Ag), chrome (Cr), molybdenum (Mo), aluminum (Al), titanium (Ti), manganese (Mn) or a mixture thereof. Alternatively, the second storage line Cst2 may have a multi layer structure with a plurality of layers that including different materials. For example, the second storage line Cst2 may include a copper layer and a titanium layer disposed on and/or under the copper layer. The second storage line Cst2 is electrically connected to a third source electrode SE3 of the third switching element SW3.

A second insulation layer 130 is formed on the data line and the second storage line Cst2. The second insulation layer 130 may include an inorganic material such as silicon oxide (SiOx) and/or silicon nitride (SiNx). For example, the second insulation layer 130 may include silicon oxide (SiOx), and may have thickness of about 500 Å. In addition, the second insulation layer 130 may include a plurality of layers that include different materials.

An organic layer CF is formed on the second insulation layer 130. The organic insulating layer CF may planarize an upper surface of the display substrate 100, to prevent step effects such as disconnection of a signal line. The organic layer CF may be an insulation layer that includes an organic material. For example, the organic layer CF may be a color filter layer.

The shielding electrode SC is disposed on the organic layer CF. The shielding electrode SC may include a first portion SC1 that overlaps the data line DL and a second portion SC2 that overlaps the gate line GL.

The shielding electrode SC may include a transparent conductive material, such as indium tin oxide (ITO), indium zinc oxide (IZO), etc. In addition, the shielding electrode SC may include titanium (Ti) and/or molybdenum titanium (MoTi).

The first portion SC1 of the shielding electrode SC may overlap the data line DL. The first portion SC1 may extend in the second direction D2. A width of the first portion SC1 may be wider than a width of the second portion SC2. In addition, the first portion SC1 of the shielding electrode SC may overlap an edge of the pixel electrode PE.

The second portion SC2 of the shielding electrode SC may overlap with the gate line GL. The second portion SC2 may extend in the first direction D1. In addition, the second portion SC2 may entirely overlap a region between pixel electrodes adjacent to each other in the second direction D2. The second portion SC2 may overlap an edge of the pixel electrode PE.

A passivation layer 140 is formed on the shielding electrode SC. The passivation layer 140 may include an inorganic material such as silicon oxide (SiOx) and/or silicon nitride (SiNx). For example, the passivation layer 140 may includes silicon oxide (SiOx), and may have thickness of about 500 Å. In addition, the passivation layer 140 may include a plurality of layers that include different materials.

The pixel electrode PE is disposed on the passivation layer 140. The pixel electrode PE may include a first sub-pixel electrode 150, a second sub-pixel electrode 160 and a third sub-pixel electrode 170.

The first sub-pixel electrode 150 may include a transparent conductive material, such as indium tin oxide (ITO), indium zinc oxide (IZO), etc. In addition, the first sub-pixel electrode 150 may include titanium (Ti) and/or molybdenum titanium (MoTi). The first sub-pixel electrode 150 may have a diamond shape. The first sub-pixel electrode 150 is electrically connected to the second sub-pixel electrode 160 through a third contact hole CNT3.

The second sub-pixel electrode 160 may be formed from the same layer as the shielding electrode SC. Thus, the second sub-pixel electrode 160 may be disposed on the same layer as the shielding electrode SC. The second sub-pixel electrode 160 may include a transparent conductive material, such as indium tin oxide (ITO), indium zinc oxide (IZO), etc. In addition, the second sub-pixel electrode 160 may include titanium (Ti) and/or molybdenum titanium (MoTi). The second sub-pixel electrode 160 overlaps an edge of the first sub-pixel electrode 150 and an edge of the third sub-pixel electrode 170.

The second sub-pixel electrode 160 is electrically connected to the first switching element SW1 through a first contact hole CNT1. In addition, the first sub-pixel electrode 150 is electrically connected to the second sub-pixel electrode 160 through a third contact hole CNT3. Thus, the first sub-pixel electrode 150 is electrically connected to the first switching element SW1.

The third sub-pixel electrode 170 may be formed from the same layer as the first sub-pixel electrode 150. Thus, the third sub-pixel electrode 170 may be disposed on the same layer as the first sub-pixel electrode 150. The third sub-pixel electrode 170 may include a transparent conductive material, such as indium tin oxide (ITO), indium zinc oxide (IZO), etc. In addition, the third sub-pixel electrode 170 may include titanium (Ti) and/or molybdenum titanium (MoTi). The third sub-pixel electrode 170 surrounds the first sub-pixel electrode 150. The third sub-pixel electrode 170 is electrically connected to the second switching element SW2 through a second contact hole CNT2.

A first voltage may be applied to the first sub-pixel electrode 150 and the second sub-pixel electrode 160. A different second voltage may be applied to the third sub-pixel electrode 170. For example, the first voltage may be higher than the second voltage. A pixel electrode portion corresponding to the first sub-pixel electrode 150 may be driven as a high-pixel. A pixel electrode portion corresponding to the second sub-pixel electrode 160 may be driven as a middle pixel. A pixel electrode portion corresponding to the third sub-pixel electrode 170 may be driven as a low-pixel.

The first switching element SW1 includes the first gate electrode GE1, the first source electrode SE1, the first drain electrode DE1 and a first channel portion CH1 that connects the first source electrode SE1 to the first drain electrode DE1.

The first channel portion CH1 may include a semiconductor layer consisting essentially of amorphous silicon (a-Si:H) and an ohmic contact layer consisting essentially of n+ amorphous silicon (n+ a-Si:H). In addition, the first channel portion CH1 may include an oxide semiconductor. The oxide semiconductor may include an amorphous oxide that includes at least one metal selected from the group consisting essentially of indium (In), zinc (Zn), gallium (Ga), tin (Sn) and hafnium (Hf).

The second switching element SW2 includes the second gate electrode GE2, the second source electrode SE2, the second drain electrode DE2 and a second channel portion CH2 that connects the second source electrode SE2 to the second drain electrode DE2.

The second channel portion CH2 may include a semiconductor layer consisting essentially of amorphous silicon (a-Si:H) and an ohmic contact layer consisting essentially of n+ amorphous silicon (n+ a-Si:H). In addition, the second channel portion CH2 may include an oxide semiconductor. The oxide semiconductor may include an amorphous oxide that includes at least one metal selected from the group consisting essentially of indium (In), zinc (Zn), gallium (Ga), tin (Sn) and hafnium (Hf).

The third switching element SW3 includes the third gate electrode GE3, the third source electrode SE3, the third drain electrode DE3 and a third channel portion CH3 that connects the third source electrode SE3 to the third drain electrode DE3.

The third channel portion CH3 may include a semiconductor layer consisting essentially of amorphous silicon (a-Si:H) and an ohmic contact layer consisting essentially of n+ amorphous silicon (n+ a-Si:H). In addition, the third channel portion CH3 may include an oxide semiconductor. The oxide semiconductor may include an amorphous oxide including at least one metal selected from the group consisting essentially of indium (In), zinc (Zn), gallium (Ga), tin (Sn) and hafnium (Hf).

According to a present exemplary embodiment, a DC voltage may be applied to the shielding electrode SC. Thus, an electric field may be blocked, which may prevent an occurrence of an afterimage. In addition, the second portion SC2 of the shielding electrode SC may entirely overlap a region between pixel electrodes adjacent to each other in the second direction D2. Thus, a black matrix may be omitted in a display substrate according to a present exemplary embodiment. Therefore, a mask for forming the black matrix may be omitted.

A display panel according to an exemplary embodiment may include the display substrate 100 of FIGS. 1 to 3, a facing substrate facing the display substrate 100 and liquid crystal layer interposed between the display substrate 100 and the facing substrate. The facing substrate may include a common electrode. The common electrode may be disposed on the entire region of the facing substrate and may include a transparent conductive material. In addition, a common voltage may be applied to the common electrode. The common voltage may also be applied to the shielding electrode SC. When the common voltage is applied to the shielding electrode SC, liquid crystal molecules disposed on the shielding electrode SC align in a vertical direction. Thus, a direction of the liquid crystal molecules may be the same as a direction of a polarizer, so that a region of the shielding electrode SC may be black. Therefore, light may be blocked without a black matrix.

Figure 4:
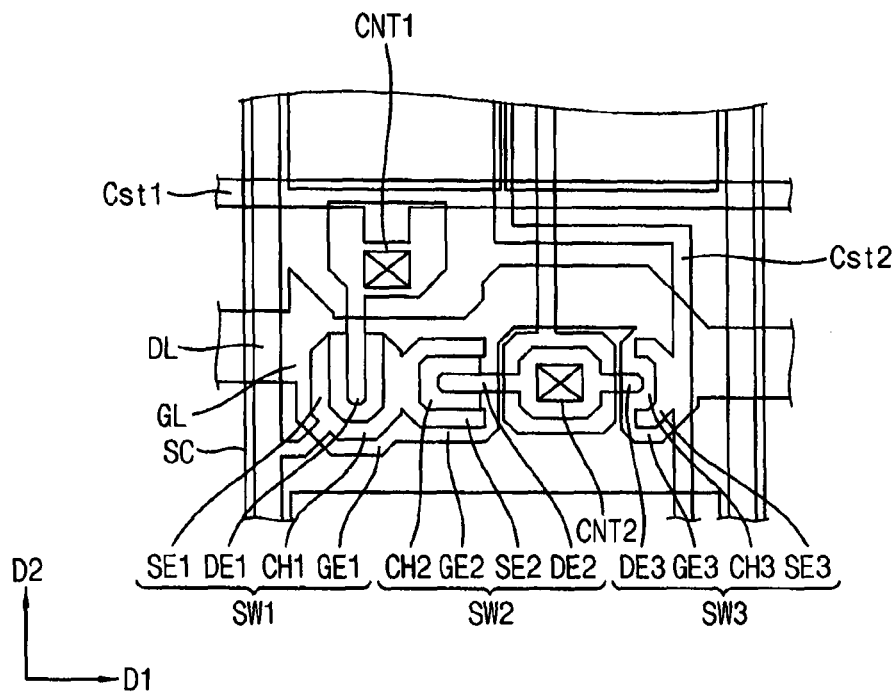
FIG. 4 is a partially enlarged view of a switching element according to an exemplary embodiment of the inventive concept.

FIG. 4 is a partially enlarged view of a switching element according to an exemplary embodiment of the inventive concept.

Referring to FIG. 4, a display substrate according to a present exemplary embodiment may include a first switching element SW1, a second switching element SW2, a third switching element SW3 and a shielding electrode SC.

The first switching element SW1 includes a first gate electrode GE1, a first source electrode SE1, a first drain electrode DE1 and a first channel portion CH1 that connects the first source electrode SE1 to the first drain electrode DE1.

The first source electrode SE1 of the first switching element SW1 is electrically connected to the data line DL. The first gate electrode GE1 of the first switching element SW1 is electrically connected to the gate line GL. The first drain electrode DE1 of the first switching element SW1 is electrically connected to the first sub-pixel electrode 150 and the second sub-pixel electrode 160.

The first channel portion CH1 may include a semiconductor layer consisting essentially of amorphous silicon (a-Si:H) and an ohmic contact layer consisting essentially of n+ amorphous silicon (n+ a-Si:H). In addition, the first channel portion CH1 may include an oxide semiconductor. The oxide semiconductor may include an amorphous oxide that includes at least one metal selected from the group consisting essentially of indium (In), zinc (Zn), gallium (Ga), tin (Sn) and hafnium (Hf).

The second switching element SW2 includes a second gate electrode GE2, a second source electrode SE2, a second drain electrode DE2 and a second channel portion CH2 that connects the second source electrode SE2 to the second drain electrode DE2.

The second source electrode SE2 of the second switching element SW2 is electrically connected to the data line DL. The second gate electrode GE2 of the second switching element SW2 is electrically connected to the gate line GL. The second drain electrode DE2 of the second switching element SW2 is electrically connected to the third sub-pixel electrode 170.

The second channel portion CH2 may include a semiconductor layer consisting essentially of amorphous silicon (a-Si:H) and an ohmic contact layer consisting essentially of n+ amorphous silicon (n+ a-Si:H). In addition, the second channel portion CH2 may include an oxide semiconductor. The oxide semiconductor may include an amorphous oxide that includes at least one metal selected from the group consisting essentially of indium (In), zinc (Zn), gallium (Ga), tin (Sn) and hafnium (Hf).

The third switching element SW3 includes a third gate electrode GE3, a third source electrode SE3, a third drain electrode DE3 and a third channel portion CH3 that connects the third source electrode SE3 to the third drain electrode DE3.

The third source electrode SE3 of the third switching element SW3 is electrically connected to the second storage line Cst2. A storage voltage may be applied to the third source electrode SE3 of the third switching element SW3. The third gate electrode GE3 of the third switching element SW3 is electrically connected to the gate line GL. The third drain electrode DE3 of the third switching element SW3 is electrically connected to the third sub-pixel electrode 170.

The third channel portion CH3 may include a semiconductor layer consisting essentially of amorphous silicon (a-Si:H) and an ohmic contact layer consisting essentially of n+ amorphous silicon (n+ a-Si:H). In addition, the third channel portion CH3 may include an oxide semiconductor. The oxide semiconductor may include an amorphous oxide that includes at least one metal selected from the group consisting essentially of indium (In), zinc (Zn), gallium (Ga), tin (Sn) and hafnium (Hf).

The second source electrode SE2 of the second switching element SW2 extends in the first direction D1. An aperture ratio of a display substrate that includes a second source electrode SE2 extending in the first direction D1 may be higher than an aperture ratio of a display substrate that includes a second source electrode SE2 extending in the second direction D2. In a present exemplary embodiment, the second source electrode SE2, a second drain electrode DE2 and the third drain electrode DE3 extend in the first direction D1. Ends of the second drain electrode DE2 and the third drain electrode DE3 may have an "I" shape.

In a manufacturing process, the second drain electrode DE2 of the second switching element SW2 and the third drain electrode DE3 of the third switching element SW3 may simultaneously move in the first direction D1. When the second drain electrode DE2 and the third drain electrode DE3 are moved in the first direction D1, a parasitic capacitance may shift in a display substrate that includes a second drain electrode DE2 extending in the first direction D1 and a third drain electrode DE3 extending in the second direction D2. Thus, an effect such as a horizontal line may occur.

However, the second drain electrode DE2 and the third drain electrode DE3 according to a present exemplary embodiment extend in the first direction D1. Thus, when the second drain electrode DE2 and the third drain electrode DE3 are moved in the first direction D1, a sum of a distance between the end of the second drain electrode DE2 and the gate line GL, and a distance between the end of the third drain electrode DE3 and the gate line GL may be constant. Thus, a parasitic capacitance may remain constant, which may prevent an effect such as a horizontal line.

Figure 5:
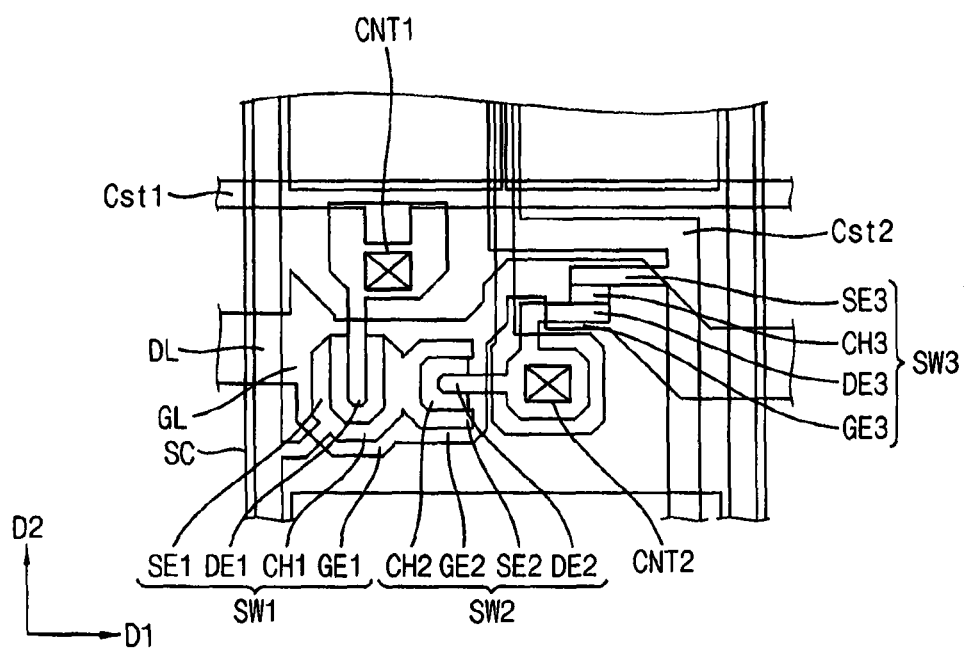
FIG. 5 is a partially enlarged view of a switching element according to an exemplary embodiment of the inventive concept.

FIG. 5 is a partially enlarged view illustrating a switching element according to an exemplary embodiment of the inventive concept.

Referring to FIG. 5, a display substrate according to a present exemplary embodiment may include a first switching element SW1, a second switching element SW2, a third switching element SW3 and a shielding electrode SC.

The first switching element SW1 includes a first gate electrode GE1, a first source electrode SE1, a first drain electrode DE1 and a first channel portion CH1 that connects the first source electrode SE1 to the first drain electrode DE1.

The first source electrode SE1 of the first switching element SW1 is electrically connected to the data line DL. The first gate electrode GE1 of the first switching element SW1 is electrically connected to the gate line GL. The first drain electrode DE1 of the first switching element SW1 is electrically connected to the first sub-pixel electrode 150 and the second sub-pixel electrode 160.

The first channel portion CH1 may include a semiconductor layer consisting essentially of amorphous silicon (a-Si:H) and an ohmic contact layer consisting essentially of n+ amorphous silicon (n+ a-Si:H). In addition, the first channel portion CH1 may include an oxide semiconductor. The oxide semiconductor may include an amorphous oxide that includes at least one metal selected from the group consisting essentially of indium (In), zinc (Zn), gallium (Ga), tin (Sn) and hafnium (Hf).

The second switching element SW2 includes a second gate electrode GE2, a second source electrode SE2, a second drain electrode DE2 and a second channel portion CH2 that connects the second source electrode SE2 to the second drain electrode DE2.

The second source electrode SE2 of the second switching element SW2 is electrically connected to the data line DL. The second gate electrode GE2 of the second switching element SW2 is electrically connected to the gate line GL. The second drain electrode DE2 of the second switching element SW2 is electrically connected to the third sub-pixel electrode 170.

The second channel portion CH2 may include a semiconductor layer consisting essentially of amorphous silicon (a-Si:H) and an ohmic contact layer consisting essentially of n+ amorphous silicon (n+ a-Si:H). In addition, the second channel portion CH2 may include an oxide semiconductor. The oxide semiconductor may include an amorphous oxide that includes at least one metal selected from the group consisting essentially of indium (In), zinc (Zn), gallium (Ga), tin (Sn) and hafnium (Hf).

The third switching element SW3 includes a third gate electrode GE3, a third source electrode SE3, a third drain electrode DE3 and a third channel portion CH3 connecting the third source electrode SE3 to the third drain electrode DE3.

The third source electrode SE3 of the third switching element SW3 is electrically connected to the second storage line Cst2. A storage voltage may be applied to the third source electrode SE3 of the third switching element SW3. The third gate electrode GE3 of the third switching element SW3 is electrically connected to the gate line GL. The third drain electrode DE3 of the third switching element SW3 is electrically connected to the third sub-pixel electrode 170.

The third channel portion CH3 may include a semiconductor layer consisting essentially of amorphous silicon (a-Si:H) and an ohmic contact layer consisting essentially of n+ amorphous silicon (n+ a-Si:H). In addition, the third channel portion CH3 may include an oxide semiconductor. The oxide semiconductor may include an amorphous oxide that includes at least one metal selected from the group consisting essentially of indium (In), zinc (Zn), gallium (Ga), tin (Sn) and hafnium (Hf).

The second source electrode SE2 of the second switching element SW2 extends in the first direction D1. An aperture ratio of a display substrate that includes a second source electrode SE2 extending in the first direction D1 may be higher than an aperture ratio of a display substrate that includes a second source electrode SE2 extending in the second direction D2. In a present exemplary embodiment, the second source electrode SE2 and the second drain electrode DE2 extend in the first direction D1. An end of the second drain electrode DE2 may have an "I" shape. An end of the third drain electrode DE3 may have an "L" shape. The end of the third drain electrode DE3 may extend in the first direction D1.

In a manufacturing process, the second drain electrode DE2 of the second switching element SW2 and the third drain electrode DE3 of the third switching element SW3 may simultaneously move in the first direction D1. When the second drain electrode DE2 and the third drain electrode DE3 are moved in the first direction D1, a parasitic capacitance may shift in a display substrate that includes a second drain electrode DE2 extending in the first direction D1 and a third drain electrode DE3 extending in the second direction D2. Thus, an effect such as a horizontal line may occur.

However, the second drain electrode DE2 and the third drain electrode DE3 according to a present exemplary embodiment extend in the first direction D1. Thus, when the second drain electrode DE2 and the third drain electrode DE3 are moved in the first direction D1, a sum of a distance between the end of the second drain electrode DE2 and the gate line GL, and a distance between the end of the third drain electrode DE3 and the gate line GL may be constant. Thus, a parasitic capacitance may remain constant, which may prevent an effect such as a horizontal line.

Figure 6:
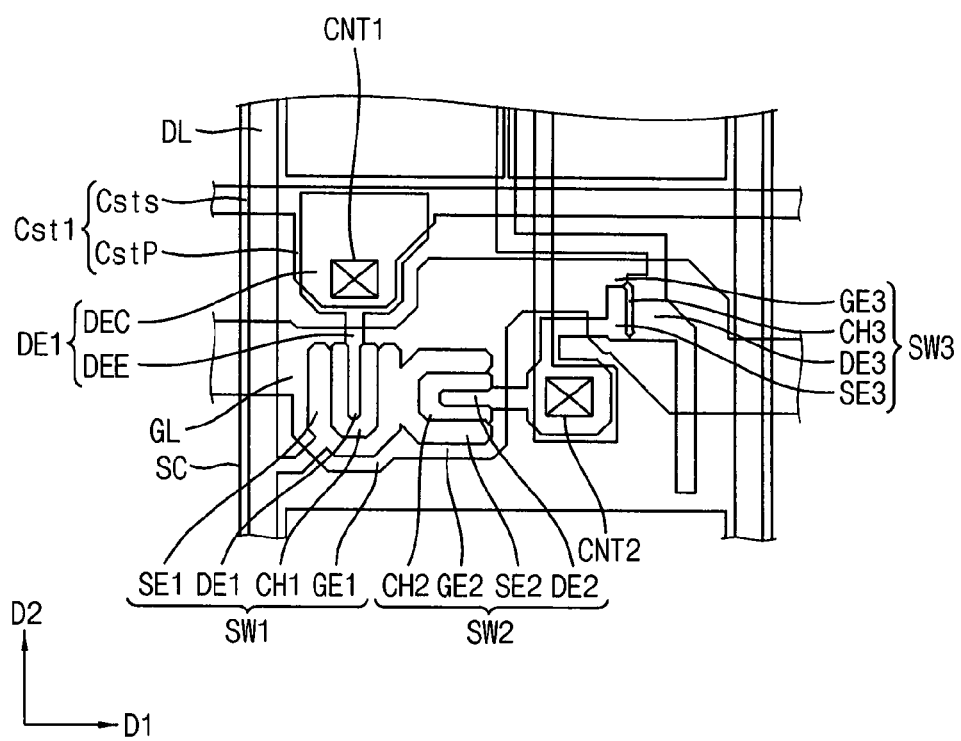
FIG. 6 is a partially enlarged view of a switching element according to an exemplary embodiment of the inventive concept.

FIG. 6 is a partially enlarged view of a switching element according to an exemplary embodiment of the inventive concept.

Referring to FIG. 6, a first drain electrode DE1 of the first switching element SW1 may include an electrode portion DEE that overlaps a gate line GL and a contact portion DEC that overlaps a first storage line Cst1.

The first storage line Cst1 may include a stem portion CstS and a protruding portion CstP that protrudes in the second direction D2 to overlap the contact portion DEC.

The contact portion DEC and the protruding portion CstP may have a substantially same area. In a present exemplary embodiment, the third sub-pixel electrode 170 surrounds the first sub-pixel electrode 150. Thus, a capacitance of the first sub-pixel electrode 150 may be smaller than a capacitance of the third sub-pixel electrode 170, so that a kickback voltage deviation may occur.

However, the contact portion DEC and the protruding portion CstP according to a present exemplary embodiment may have a substantially same area. That is, the protruding portion CstP has a greater area. Thus, the first sub-pixel electrode 150 has a larger capacitance, which may compensate the kickback voltage deviation.

FIGS. 7 to 12 are cross-sectional views of a method of manufacturing the display substrate of FIG. 2.

Figure 7:
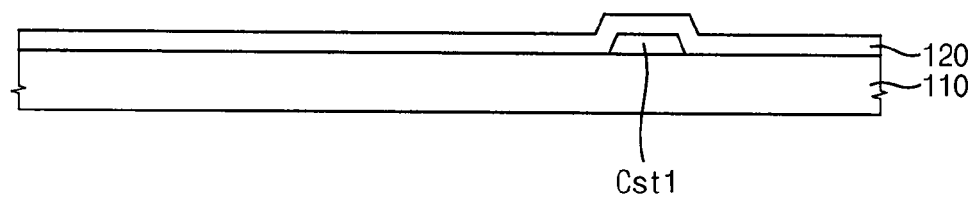
FIGS. 7 to 12 are cross-sectional views of a method of manufacturing the display substrate of FIG. 2.

Referring to FIG. 7, a gate metal layer is formed on a base substrate 110, and then the gate metal layer may be partially etched by a photolithography process or an etching process using an etching mask. Hence, a gate pattern is formed. The gate pattern includes a first storage line Cst1, a gate line GL, a first gate electrode GE1, a second gate electrode GE2 and a third gate electrode GE3.

The base substrate 110 may include a material which has a relatively high transmittance, thermal resistance, and chemical resistance. For example, the base substrate 110 may include a compound selected from the group consisting essentially of glass, polyethylenenaphthalate, polyethylene terephthalate, polyacryl and a mixture thereof.

The gate pattern may include a metal, a metal alloy, a metal nitride, a conductive metal oxide, a transparent conductive material, etc. For example, the gate pattern may include copper (Cu), which is opaque.

The first insulation layer 120 is formed on the base substrate on which gate pattern is formed. The first insulation layer 120 is formed on the gate pattern. The first insulation layer 120 covers and insulates the first storage line Cst1, the gate line GL, the first gate electrode GE1, the second gate electrode GE2 and the third gate electrode GE3.

Figure 8:
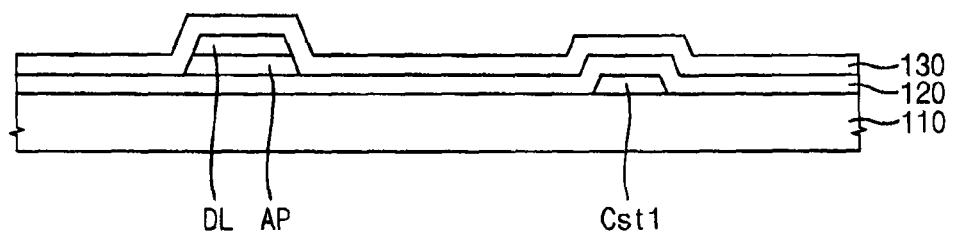

Referring to FIG. 8, a semiconductor layer and a data metal layer are formed on the base substrate 110, and then the semiconductor layer and the data metal layer may be partially etched by a photolithography process or an etching process using an additional etching mask. Hence, a channel layer AP that includes a first channel portion CH1, a second channel portion CH2 and a third channel portion CH3, and a data pattern are formed. The semiconductor layer may include a silicon semiconductor layer consisting essentially of amorphous silicon (a-Si:H) and an ohmic contact layer consisting essentially of n+ amorphous silicon (n+ a-Si:H). In addition, the semiconductor layer may include an oxide semiconductor. The oxide semiconductor may include an amorphous oxide that includes at least one metal selected from the group consisting essentially of indium (In), zinc (Zn), gallium (Ga), tin (Sn) and hafnium (Hf).

The data pattern includes a first drain electrode DE1, a first source electrode SE1, a second source electrode SE2, a second drain electrode DE2, a third source electrode SE3, a third drain electrode DE3, a first data line and a second data line. Note that for clarity, only one data line DL is shown in FIG. 8. The semiconductor layer and the metal layer may be patterned at the same time, and then a portion of the patterned metal layer is removed. Hence, the first source electrode SE1 and the first drain electrode DE1 spaced apart from the first source electrode SE1 are formed. In addition, the second source electrode SE2 and the second drain electrode DE2 spaced apart from the second source electrode SE2 may be formed by removing a portion of the patterned metal layer. Furthermore, the third source electrode SE3 and the third drain electrode DE3 spaced apart from the third source electrode SE3 may be formed by removing a portion of the patterned metal layer.

A second insulation layer 130 is formed on the base substrate 110 on which the data pattern and the channel layer AP are formed.

The second insulation layer 130 may be formed by a spin coating process, a printing process, a sputtering process, a CVD process, an ALD process, a PECVD process, an HDP-CVD process or a vacuum evaporation process depending on the materials included in the second insulation layer 130. The second insulation layer 130 is formed on the data pattern. The second insulation layer 130 covers and insulates the first drain electrode DE1, the first source electrode SE1, the second source electrode SE2, the second drain electrode DE2, the third source electrode SE3, the third drain electrode DE3 and the data line DL.

Figure 9:
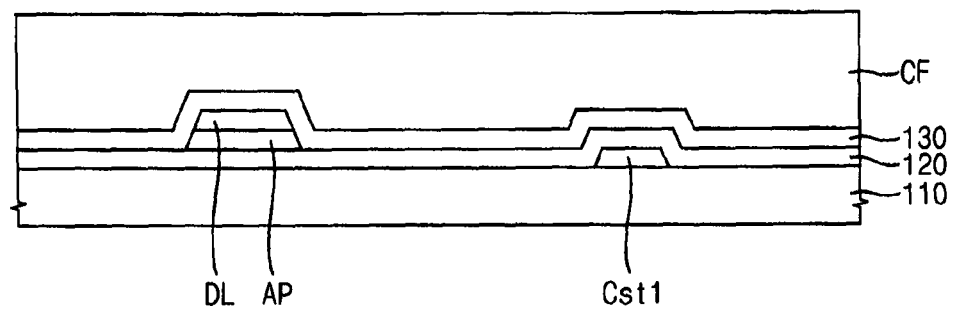

Referring to FIG. 9, an organic layer CF is formed on the base substrate 110 on which the second insulation layer 130 is formed. The organic layer CF may be a color filter layer. A photoresist may be formed on the second insulation layer 130. The photoresist is exposed using a mask, and then developed using a developing solution. Hence, the organic layer CF may be formed.

The organic layer CF is disposed on the second insulation layer 130. When the organic layer CF is a color filter layer, the color filter layer imparts colors to the light passing through the liquid crystal layer. The color filter layer may include a red filter layer, a green filter layer and blue filter layer. The color filter layer may correspond to a unit pixel. Adjacent color filter layers may have different colors. The color filter layer may overlap an adjacent color filter layer in a boundary between adjacent unit pixels. Alternatively, the color filter layer may be spaced apart from an adjacent color filter layer at the boundary between adjacent unit pixels.

Figure 10:
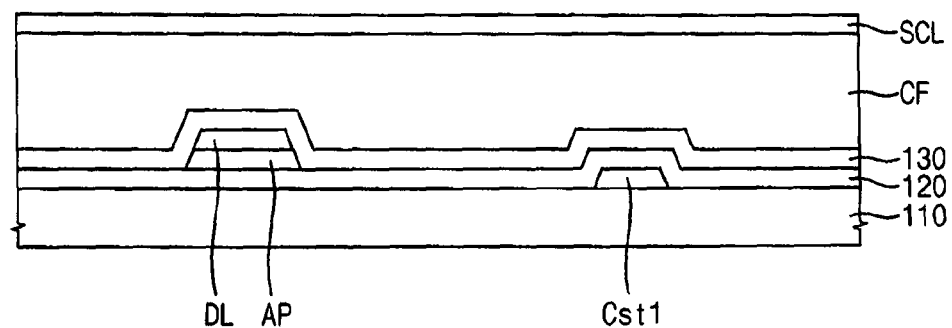

Referring to FIG. 10, a shielding electrode layer SCL is formed on the base substrate 110 on which the organic layer CF is formed.

The shielding electrode layer SCL may include a transparent conductive material, such as indium tin oxide (ITO), indium zinc oxide (IZO), etc. In addition, the shielding electrode layer SCL may include titanium (Ti) and/or molybdenum titanium (MoTi).

Figure 11:
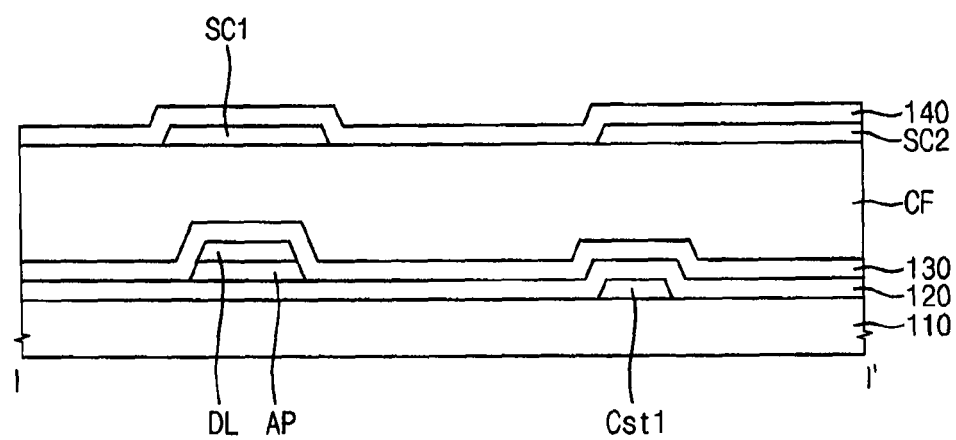

Referring to FIG. 11, the shielding electrode layer SCL may be patterned to form the shielding electrode SC. The shielding electrode SC may include a first portion SC1 and a second portion SC2.

The first portion SC1 of the shielding electrode SC may overlap the data line DL. The first portion SC1 may extend in the second direction D2. A width of the first portion SC1 may be wider than a width of the second portion SC2.

The second portion SC2 of the shielding electrode SC may overlap the gate line GL. The second portion SC2 may extend in the first direction D1. In addition, the second portion SC2 may entirely overlap a region between pixel electrodes adjacent to each other in the second direction D2.

The passivation layer 140 is formed on the base substrate 110 on which the shielding electrode SC is formed. The passivation layer 140 may include an inorganic material such as silicon oxide (SiOx) and/or silicon nitride (SiNx). For example, the passivation layer 140 may include silicon oxide (SiOx), and may have thickness about 500 Å. In addition, the passivation layer 140 may include a plurality of layers that include different materials.

Figure 12:
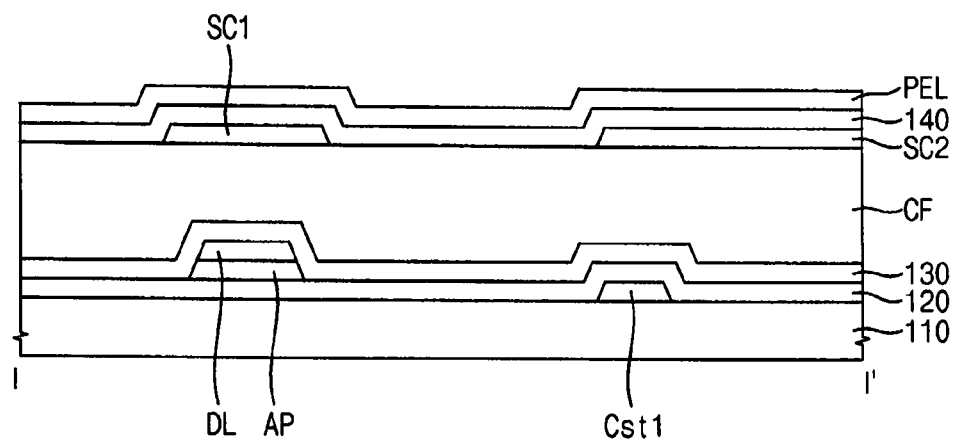

Referring to FIG. 12, a pixel electrode layer PEL is formed on the base substrate 110 on which the passivation layer 140 is formed.

The pixel electrode layer PEL may include a transparent conductive material, such as indium tin oxide (ITO), indium zinc oxide (IZO), etc. In addition, the pixel electrode layer PEL may include titanium (Ti) and/or molybdenum titanium (MoTi).

Referring to FIGS. 1 to 3, the pixel electrode layer PEL is patterned to form the pixel electrode PE. The pixel electrode PE may include a first sub-pixel electrode 150, a second sub-pixel electrode 160 and a third sub-pixel electrode 170. The first and second portions SC1, SC2 of the shielding electrode SC may each overlap an edge of the pixel electrode PE.

The first sub-pixel electrode 150 may have a diamond shape. The first sub-pixel electrode 150 is electrically connected to the second sub-pixel electrode 160 through a third contact hole CNT3.

The second sub-pixel electrode 160 may be formed from the same layer as the shielding electrode SC. Thus, the second sub-pixel electrode 160 may be disposed on the same layer as the shielding electrode SC. The second sub-pixel electrode 160 overlaps an edge of the first sub-pixel electrode 150 and an edge of the third sub-pixel electrode 170.

The second sub-pixel electrode 160 is electrically connected to the first switching element SW1 through a first contact hole CNT1. In addition, the first sub-pixel electrode 150 is electrically connected to the second sub-pixel electrode 160 through a third contact hole CNT3. Thus, the first sub-pixel electrode 150 is electrically connected to the first switching element SW1.

The third sub-pixel electrode 170 may be formed from the same layer as the first sub-pixel electrode 150. Thus, the third sub-pixel electrode 170 may be disposed on the same layer as the first sub-pixel electrode 150. The third sub-pixel electrode 170 surrounds the first sub-pixel electrode 150. The third sub-pixel electrode 170 is electrically connected to the second switching element SW2 through a second contact hole CNT2.

Figure 13:
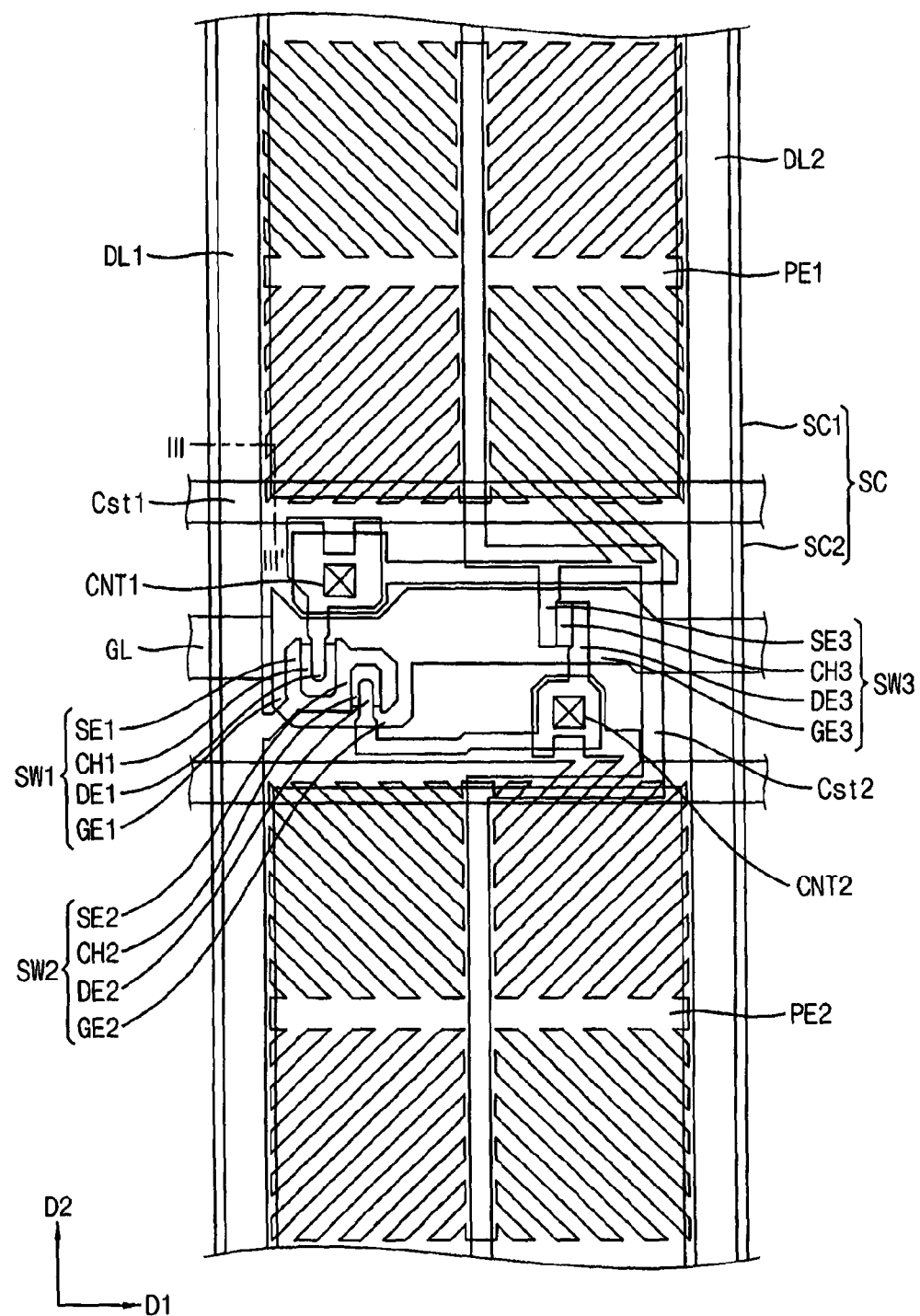
FIG. 13 is a plan view of a display substrate according to an exemplary embodiment of the inventive concept.
Figure 14:
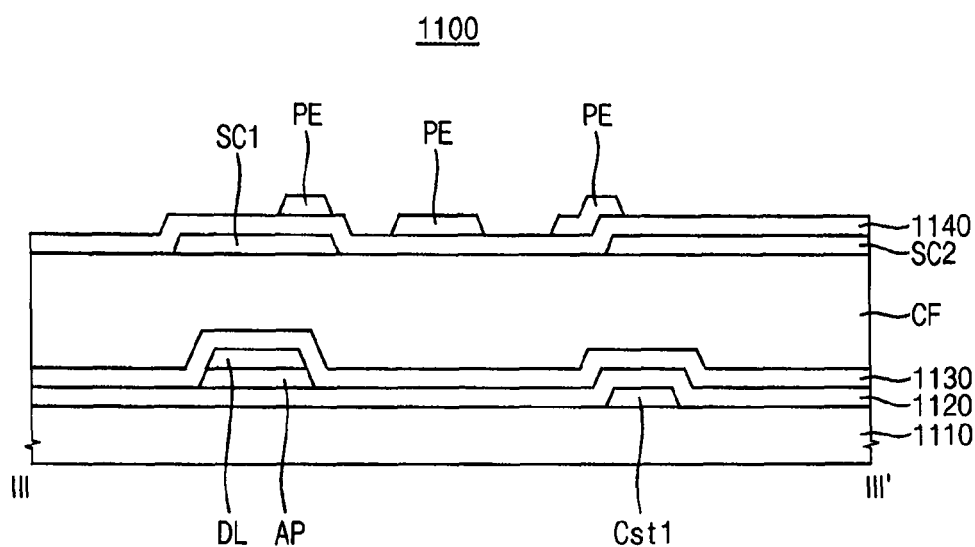
FIG. 14 is a cross-sectional view taken along a line II-II' of FIG. 13.

FIG. 13 is a plan view of a display substrate according to an exemplary embodiment of the inventive concept. FIG. 14 is a cross-sectional view taken along a line III-III' of FIG. 13.

Referring to FIGS. 13 and 14, a display substrate 1100 includes a gate line GL, a data line DL, a first storage line Cst1, a second storage line Cst2, a first switching element SW1, a second switching element SW2, a third switching element SW3, a shielding electrode SC, and a pixel electrode PE. The pixel electrode PE may include a high-pixel electrode PE1 and a low-pixel electrode PE2.

The gate line GL extends in a first direction D1. The gate line GL may have a single layer structure that includes copper (Cu), silver (Ag), chrome (Cr), molybdenum (Mo), aluminum (Al), titanium (Ti), manganese (Mn) or a mixture thereof. Alternatively, the gate line GL may have a multi layer structure with a plurality of layers that include different materials. For example, the gate line GL may include a copper layer and a titanium layer disposed on and/or under the copper layer. The gate line GL is electrically connected to a first gate electrode GE1 of the first switching element SW1, a second gate electrode GE2 of the second switching element SW2, and a third gate electrode GE3 of the third switching element SW3. In addition, portions of the gate line GL may form the first gate electrode GE1, the second gate electrode GE2, and the third gate electrode GE3.

The data line DL extends in a second direction D2 substantially perpendicular to the first direction D1. The data line DL may have a single layer structure that includes copper (Cu), silver (Ag), chrome (Cr), molybdenum (Mo), aluminum (Al), titanium (Ti), manganese (Mn) and a mixture thereof. Alternatively, the data line DL may have a multi layer structure with a plurality of layers that include different materials. For example, the data line DL may include a copper layer and a titanium layer disposed on and/or under the copper layer. The data line DL is electrically connected to a first source electrode SE1 of the first switching element SW1, and a second source electrode SE2 of the second switching element SW2.

The high-pixel electrode PE1 is disposed adjacent to the gate line GL in the second direction D2, and between a first data line DL1 and a second data line DL2. The high-pixel electrode PE1 is electrically connected to a first drain electrode DE1 of the first switching element SW1 through a first contact hole CNT1.

The low-pixel electrode PE2 is disposed opposite to the high-pixel electrode PE1 with respect to the gate line GL, and between the first data line DL1 and the second data line DL2. The low-pixel electrode PE2 is electrically connected to the second drain electrode DE2 of the second switching element SW2 and the third drain electrode DE3 of the third switching element SW3 through a second contact hole CNT2.

A first voltage may be applied to the high-pixel electrode PE1. A different, second voltage may be applied to the low-pixel electrode PE2. For example, the first voltage may be higher than the second voltage, and a the high-pixel electrode PE1 may be driven as a high pixel, and the low-pixel electrode PE2 may be driven as a low pixel.

The first storage line Cst1 extends in a first direction D1. The first storage line Cst1 overlaps the high-pixel electrode PE1. The first storage line Cst1 may be formed from the same layer as the gate line GL. Thus, the first storage line Cst1 may be disposed on the same layer as the gate line GL.

The first storage line Cst1 may have a single layer structure that includes copper (Cu), silver (Ag), chrome (Cr), molybdenum (Mo), aluminum (Al), titanium (Ti), manganese (Mn), or a mixture thereof. Alternatively, the first storage line Cst1 may have a multi layer structure with a plurality of layers that include different materials. For example, the first storage line Cst1 may include a copper layer and a titanium layer disposed on and/or under the copper layer.

The second storage line Cst2 may be formed from the same layer as the data line DL. Thus, the second storage line Cst2 may be disposed on the same layer as the data line DL. The second storage line Cst2 may have a single layer structure that includes copper (Cu), silver (Ag), chrome (Cr), molybdenum (Mo), aluminum (Al), titanium (Ti), manganese (Mn), or a mixture thereof. Alternatively, the second storage line Cst2 may have a multi layer structure with a plurality of layers that include different materials. For example, the second storage line Cst2 may include a copper layer and a titanium layer disposed on and/or under the copper layer. The second storage line Cst2 is electrically connected to a third source electrode SE3 of the third switching element SW3.

A second insulation layer 1130 is disposed on the data line and the second storage line Cst2. The second insulation layer 1130 may include an inorganic material such as silicon oxide (SiOx) and/or silicon nitride (SiNx). For example, the second insulation layer 1130 may include silicon oxide (SiOx), and may have thickness of about 500 Å. Alternatively, the second insulation layer 1130 may include a plurality of layers that include different materials.

An organic layer CF is disposed on the second insulation layer 1130. The organic insulating layer CF may planarize an upper surface of the display substrate 1100, to prevent step effects such as disconnection of a signal line. The organic layer CF may be an insulation layer that includes an organic material. For example, the organic layer CF may be a color filter layer.

The shielding electrode SC is disposed on the organic layer CF. The shielding electrode SC may include a first portion SC1 that overlaps the data line DL and a second portion SC2 that overlaps the gate line GL.

The shielding electrode SC may include a transparent conductive material, such as indium tin oxide (ITO), indium zinc oxide (IZO) and etc. In addition, the shielding electrode SC may include titanium (Ti) and/or molybdenum titanium (MoTi).

The first portion SC1 of the shielding electrode SC may overlap the data line DL. The first portion SC1 may extend in the second direction D2. A width of the first portion SC1 may be wider than a width of the second portion SC2.

The second portion SC2 of the shielding electrode SC may overlap the gate line GL. The second portion SC2 may extend in the first direction D1. In addition, the second portion SC2 may entirely overlap a region between pixel electrodes adjacent to each other in the second direction D2.

A passivation layer 1140 is disposed on the shielding electrode SC. The passivation layer 1140 may include an inorganic material such as silicon oxide (SiOx) and/or silicon nitride (SiNx). For example, the passivation layer 140 may include silicon oxide (SiOx), and may have thickness about 500 Å. In addition, the passivation layer 1140 may include a plurality of layers that include different materials.

The pixel electrode PE is disposed on the passivation layer 1140. The pixel electrode PE may include a high-pixel electrode PE1 and a low-pixel electrode PE2.

The first switching element SW1 includes the first gate electrode GE1, the first source electrode SE1, the first drain electrode DE1 and a first channel portion CH1 that connects the first source electrode SE1 to the first drain electrode DE1.

The first channel portion CH1 may include a semiconductor layer consisting essentially of amorphous silicon (a-Si:H) and an ohmic contact layer consisting essentially of n+ amorphous silicon (n+ a-Si:H). In addition, the first channel portion CH1 may include an oxide semiconductor. The oxide semiconductor may include an amorphous oxide that includes at least one metal selected from the group consisting essentially of indium (In), zinc (Zn), gallium (Ga), tin (Sn) and hafnium (Hf).

The second switching element SW2 includes the second gate electrode GE2, the second source electrode SE2, the second drain electrode DE2 and a second channel portion CH2 that connects the second source electrode SE2 to the second drain electrode DE2.

The second channel portion CH2 may include a semiconductor layer consisting essentially of amorphous silicon (a-Si:H) and an ohmic contact layer consisting essentially of n+ amorphous silicon (n+ a-Si:H). In addition, the second channel portion CH2 may include an oxide semiconductor. The oxide semiconductor may include an amorphous oxide that includes at least one metal selected from the group consisting essentially of indium (In), zinc (Zn), gallium (Ga), tin (Sn) and hafnium (Hf).

The third switching element SW3 includes the third gate electrode GE3, the third source electrode SE3, the third drain electrode DE3 and a third channel portion CH3 that connects the third source electrode SE3 to the third drain electrode DE3.

The third channel portion CH3 may include a semiconductor layer consisting essentially of amorphous silicon (a-Si:H) and an ohmic contact layer consisting essentially of n+ amorphous silicon (n+ a-Si:H). In addition, the third channel portion CH3 may include an oxide semiconductor. The oxide semiconductor may include an amorphous oxide that includes at least one metal selected from the group consisting essentially of indium (In), zinc (Zn), gallium (Ga), tin (Sn) and hafnium (Hf).

According to a present exemplary embodiment, a DC voltage may be applied to the shielding electrode SC. Thus, an electric field may be blocked, which may prevent an occurrence of an afterimage. In addition, the second portion SC2 of the shielding electrode SC may entirely overlap a region between pixel electrodes adjacent to each other in the second direction D2. Thus, a black matrix may be omitted in a display substrate according to a present exemplary embodiment. Therefore, a mask for forming the black matrix may be omitted.

A display panel according to another exemplary embodiment may include the display substrate 1100 of FIGS. 13-14, a facing substrate facing the display substrate 1100 and liquid crystal layer interposed between the display substrate 1100 and the facing substrate. The facing substrate may include a common electrode. The common electrode is disposed on an entire region of the facing substrate and may include a transparent conductive material. In addition, a common voltage may be applied to the common electrode. The common voltage may be applied to the shielding electrode SC. When the common voltage is applied to the shielding electrode SC, liquid crystal molecules disposed on the shielding electrode SC align in a vertical direction. Thus, a direction of the liquid crystal molecules may be to the same as a direction of a polarizer, so that a region on the shielding electrode SC may be black. Therefore, light may be blocked without a black matrix.

Figure 15:
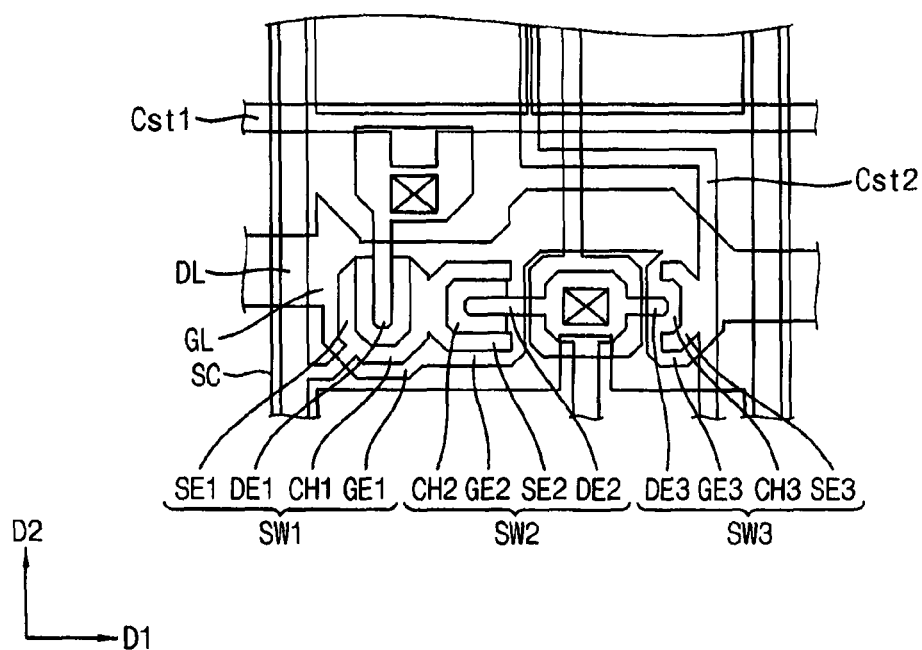
FIG. 15 is a partially enlarged view of a switching element according to an exemplary embodiment of the inventive concept.

FIG. 15 is a partially enlarged view of a switching element according to an exemplary embodiment of the inventive concept.

Referring to FIG. 15, a display substrate according to the present exemplary embodiment may include a first switching element SW1, a second switching element SW2, a third switching element SW3 and a shielding electrode SC.

The first switching element SW1 includes the first gate electrode GE1, the first source electrode SE1, the first drain electrode DE1 and the first channel portion CH1 that connects the first source electrode SE1 to the first drain electrode DE1.

The first source electrode SE1 of the first switching element SW1 is electrically connected to the data line DL. The first gate electrode GE1 of the first switching element SW1 is electrically connected to the gate line GL. The first drain electrode DE1 of the first switching element SW1 is electrically connected to the high-pixel electrode PE1.

The first channel portion CH1 may include a semiconductor layer consisting essentially of amorphous silicon (a-Si:H) and an ohmic contact layer consisting essentially of n+ amorphous silicon (n+ a-Si:H). In addition, the first channel portion CH1 may include an oxide semiconductor. The oxide semiconductor may include an amorphous oxide that includes at least one metal selected from the group consisting essentially of indium (In), zinc (Zn), gallium (Ga), tin (Sn) and hafnium (Hf).

The second switching element SW2 includes the second gate electrode GE2, the second source electrode SE2, the second drain electrode DE2 and the second channel portion CH2 that connects the second source electrode SE2 to the second drain electrode DE2.

The second source electrode SE2 of the second switching element SW2 is electrically connected to the data line DL. The second gate electrode GE2 of the second switching element SW2 is electrically connected to the gate line GL. The second drain electrode DE2 of the second switching element SW2 is electrically connected to the low-pixel electrode PE2.

The second channel portion CH2 may include a semiconductor layer consisting essentially of amorphous silicon (a-Si:H) and an ohmic contact layer consisting essentially of n+ amorphous silicon (n+ a-Si:H). In addition, the second channel portion CH2 may include an oxide semiconductor. The oxide semiconductor may include an amorphous oxide that includes at least one metal selected from the group consisting of indium (In), zinc (Zn), gallium (Ga), tin (Sn) and hafnium (Hf).

The third switching element SW3 includes the third gate electrode GE3, the third source electrode SE3, the third drain electrode DE3 and the third channel portion CH3 that connects the third source electrode SE3 to the third drain electrode DE3.

The third source electrode SE3 of the third switching element SW3 is electrically connected to the second storage line Cst2. A storage voltage may applied to the third source electrode SE3 of the third switching element SW3. The third gate electrode GE3 of the third switching element SW3 is electrically connected to the gate line GL. The third drain electrode DE3 of the third switching element SW3 is electrically connected to the low-pixel electrode PE2.

The third channel portion CH3 may include a semiconductor layer consisting essentially of amorphous silicon (a-Si:H) and an ohmic contact layer consisting essentially of n+ amorphous silicon (n+ a-Si:H). In addition, the third channel portion CH3 may include an oxide semiconductor. The oxide semiconductor may include an amorphous oxide that includes at least one metal selected from the group consisting essentially of indium (In), zinc (Zn), gallium (Ga), tin (Sn) and hafnium (Hf).

The second source electrode SE2 of the second switching element SW2 extends in the first direction D1. An aperture ratio of a display substrate that includes a second source electrode SE2 extending in the first direction D1 may be higher than an aperture ratio of a display substrate that includes a second source electrode SE2 extending in the second direction D2. In a present exemplary embodiment, the second source electrode SE2, a second drain electrode DE2 and the third drain electrode DE3 extend in the first direction D1. The ends of the second drain electrode DE2 and the third drain electrode DE3 may have an "I" shape.

In a manufacturing process, the second drain electrode DE2 of the second switching element SW2 and the third drain electrode DE3 of the third switching element SW3 may simultaneously move in the first direction D1. When the second drain electrode DE2 and the third drain electrode DE3 are moved in the first direction D1, a parasitic capacitance may shift in a display substrate that includes a second drain electrode DE2 extending in the first direction D1 and a third drain electrode DE3 extending in the second direction D2. Thus, an effect such as a horizontal line may occur.

However, the second drain electrode DE2 and the third drain electrode DE3 according to a present exemplary embodiment extend in the first direction D1. Thus, when the second drain electrode DE2 and the third drain electrode DE3 move in the first direction D1, a sum of a distance between the end of the second drain electrode DE2 and the gate line GL, and a distance between the end of the third drain electrode DE3 and the gate line GL may be constant. Thus, a parasitic capacitance may remain constant, which may prevent an effect such as a horizontal line.

Figure 16:
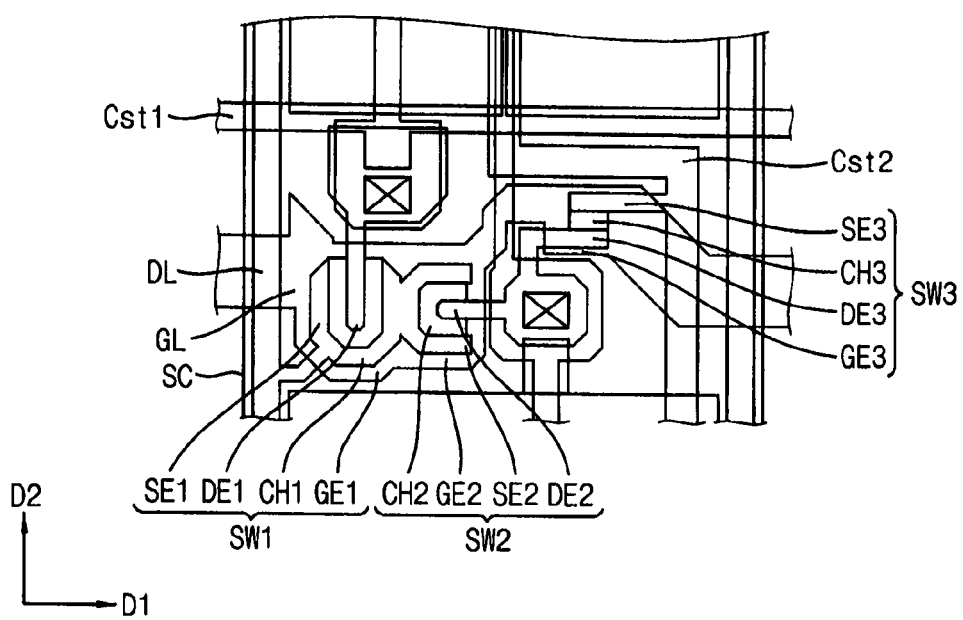
FIG. 16 is a partially enlarged view of a switching element according to an exemplary embodiment of the inventive concept.

FIG. 16 is a partially enlarged view of a switching element according to an exemplary embodiment of the inventive concept.

Referring to FIG. 16, a display substrate according to the present exemplary embodiment may include a first switching element SW1, a second switching element SW2, a third switching element SW3 and a shielding electrode SC.

The first switching element SW1 includes the first gate electrode GE1, the first source electrode SE1, the first drain electrode DE1 and the first channel portion CH1 that connects the first source electrode SE1 to the first drain electrode DE1.

The first source electrode SE1 of the first switching element SW1 is electrically connected to the data line DL. The first gate electrode GE1 of the first switching element SW1 is electrically connected to the gate line GL. The first drain electrode DE1 of the first switching element SW1 is electrically connected to the high-pixel electrode PE1.

The first channel portion CH1 may include a semiconductor layer consisting essentially of amorphous silicon (a-Si:H) and an ohmic contact layer consisting essentially of n+ amorphous silicon (n+ a-Si:H). In addition, the first channel portion CH1 may include an oxide semiconductor. The oxide semiconductor may include an amorphous oxide that includes at least one metal selected from the group consisting essentially of indium (In), zinc (Zn), gallium (Ga), tin (Sn) and hafnium (Hf).

The second switching element SW2 includes the second gate electrode GE2, the second source electrode SE2, the second drain electrode DE2 and the second channel portion CH2 that connects the second source electrode SE2 to the second drain electrode DE2.

The second source electrode SE2 of the second switching element SW2 is electrically connected to the data line DL. The second gate electrode GE2 of the second switching element SW2 is electrically connected to the gate line GL. The second drain electrode DE2 of the second switching element SW2 is electrically connected to the low-pixel electrode PE2.

The second channel portion CH2 may include a semiconductor layer consisting essentially of amorphous silicon (a-Si:H) and an ohmic contact layer consisting essentially of n+ amorphous silicon (n+ a-Si:H). In addition, the second channel portion CH2 may include an oxide semiconductor. The oxide semiconductor may include an amorphous oxide that includes at least one metal selected from the group consisting essentially of indium (In), zinc (Zn), gallium (Ga), tin (Sn) and hafnium (Hf).

The third switching element SW3 includes the third gate electrode GE3, the third source electrode SE3, the third drain electrode DE3 and the third channel portion CH3 that connects the third source electrode SE3 to the third drain electrode DE3.

The third source electrode SE3 of the third switching element SW3 is electrically connected to the second storage line Cst2. A storage voltage may be applied to the third source electrode SE3 of the third switching element SW3. The third gate electrode GE3 of the third switching element SW3 is electrically connected to the gate line GL. A third drain electrode DE3 of the third switching element SW3 is electrically connected to the low-pixel electrode PE2.

The third channel portion CH3 may include a semiconductor layer consisting essentially of amorphous silicon (a-Si:H) and an ohmic contact layer consisting essentially of n+ amorphous silicon (n+ a-Si:H). In addition, the third channel portion CH3 may include an oxide semiconductor. The oxide semiconductor may include an amorphous oxide that includes at least one metal selected from the group consisting essentially of indium (In), zinc (Zn), gallium (Ga), tin (Sn) and hafnium (Hf).

The second source electrode SE2 of the second switching element SW2 extends in the first direction D1. An aperture ratio of a display substrate that includes a second source electrode SE2 extending in the first direction D1 may be higher than an aperture ratio of a display substrate that includes a second source electrode SE2 extending in the second direction D2. In a present exemplary embodiment, the second source electrode SE2 and the second drain electrode DE2 extend in the first direction D1. An end of the second drain electrode DE2 may have an "I" shape. An end of the third drain electrode DE3 may have an "L" shape. The end of the third drain electrode DE3 extends in the first direction D1.

In a manufacturing process, the second drain electrode DE2 of the second switching element SW2 and the third drain electrode DE3 of the third switching element SW3 may simultaneously move in the first direction D1. When the second drain electrode DE2 and the third drain electrode DE3 are moved in the first direction D1, a parasitic capacitance may shift in a display substrate that includes a second drain electrode DE2 extending in the first direction D1 and a third drain electrode DE3 extending in the second direction D2. Thus, an effect such as a horizontal line may occur.

However, the second drain electrode DE2 and the third drain electrode DE3 according to a present exemplary embodiment extend in the first direction D1. Thus, when the second drain electrode DE2 and the third drain electrode DE3 move in the first direction D1, a sum of a distance between the end of the second drain electrode DE2 and the gate line GL, and a distance between the end of the third drain electrode DE3 and the gate line GL may be constant. Thus, a parasitic capacitance may remain constant, which may prevent an effect such as a horizontal line.

FIGS. 17 to 22 are cross-sectional views illustrating a method of manufacturing the display substrate of FIG. 14.

Figure 17:
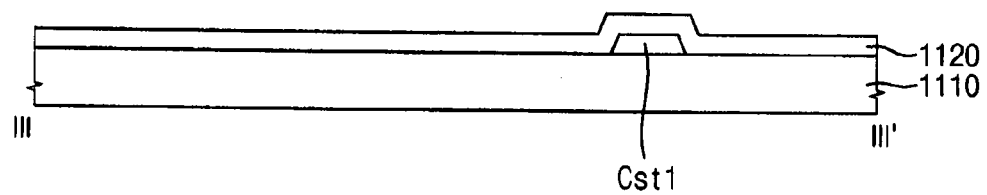
FIGS. 17 to 22 are cross-sectional views of a method of manufacturing the display substrate of FIG. 14.

Referring to FIG. 17, a gate metal layer is formed on a base substrate 1100, and then the gate metal layer may be partially etched by a photolithography process or an etching process using an etching mask. Hence, a gate pattern is formed. The gate pattern includes a first storage line Cst1, a gate line GL, a first gate electrode GE1, a second gate electrode GE2 and a third gate electrode GE3.

The base substrate 1110 may include a material which has a relatively high transmittance, thermal resistance, and chemical resistance. For example, the base substrate 110 may include a compound selected from the group consisting essentially of glass, polyethylenenaphthalate, polyethylene terephthalate, polyacryl and a mixture thereof.

The gate pattern may include a metal, a metal alloy, a metal nitride, a conductive metal oxide, a transparent conductive material, etc. For example, the gate pattern may include copper (Cu) which is opaque.

The first insulation layer 1120 is formed on the base substrate on which gate pattern is formed. The first insulation layer 1120 is formed on the gate pattern. The first insulation layer 1120 covers and insulates the first storage line Cst1, the gate line GL, the first gate electrode GE1, the second gate electrode GE2 and the third gate electrode GE3.

Figure 18:
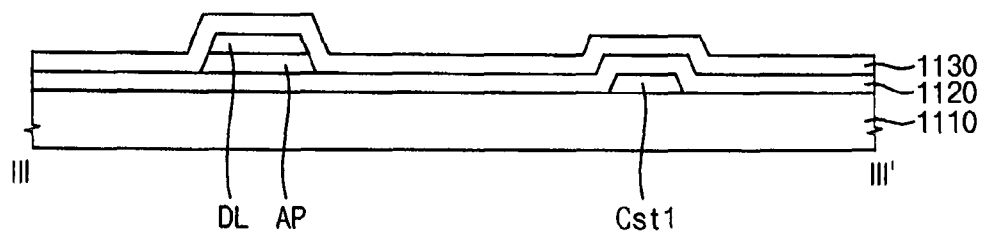

Referring to FIG. 18, a semiconductor layer and a data metal layer are formed on the base substrate 1110 on which the first insulation layer 1120 is formed, and then the semiconductor layer and the data metal layer may be partially etched by a photolithography process or an etching process using an additional etching mask. Hence, a channel layer AP that includes a first channel portion CHL a second channel portion CH2 and a third channel portion CH3, and a data pattern are formed. The semiconductor layer may include a silicon semiconductor layer consisting essentially of amorphous silicon (a-Si:H) and an ohmic contact layer consisting essentially of n+ amorphous silicon (n+ a-Si:H). In addition, the semiconductor layer may include an oxide semiconductor. The oxide semiconductor may include an amorphous oxide that includes at least one metal selected from the group consisting essentially of indium (In), zinc (Zn), gallium (Ga), tin (Sn) and hafnium (Hf).

The data pattern includes a first drain electrode DE1, a first source electrode SE1, a second source electrode SE2, a second drain electrode DE2, a third source electrode SE3, a third drain electrode DE3, a first data line and a second data line. Note that for clarity, only one data line DL is shown in FIG. 18. The semiconductor later and the metal layer may be patterned at the same time, and then a portion of the patterned metal layer is removed. Hence, the first source electrode SE1 and the first drain electrode DE1 spaced apart from the first source electrode SE1 are formed. In addition, the second source electrode SE2 and the second drain electrode DE2 spaced apart from the second source electrode SE2 may be formed by removing a portion of the patterned metal layer. Furthermore, the third source electrode SE3 and the third drain electrode DE3 spaced apart from the third source electrode SE3 may be formed by removing a portion of the patterned metal layer.

A second insulation layer 1130 is formed on the base substrate 1110 on which the data pattern and the channel layer AP are formed.

The second insulation layer 1130 may be formed by a spin coating process, a printing process, a sputtering process, a CVD process, an ALD process, a PECVD process, an HDP-CVD process or a vacuum evaporation process depending on the materials included in the second insulation layer 1130. The second insulation layer 1130 is formed on the data pattern. The second insulation layer 1130 covers and insulates the first drain electrode DE1, the first source electrode SE1, the second source electrode SE2, the second drain electrode DE2, the third source electrode SE3, the third drain electrode DE3 and the data line DL.

Figure 19:
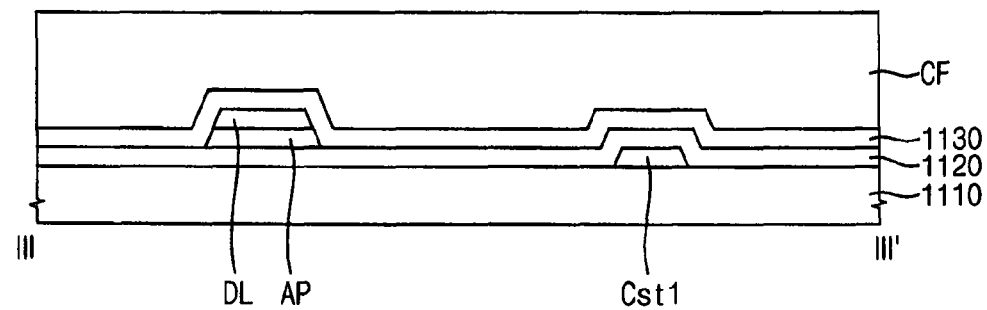

Referring to FIG. 19, an organic layer CF is formed on the base substrate 1110 on which the second insulation layer 1130 is formed. The organic layer CF may be a color filter layer. A photoresist may be formed on the second insulation layer 1130. The photoresist is exposed using a mask, and then developed using a developing solution. Hence, the organic layer CF may be formed.

The organic layer CF is disposed on the second insulation layer 1130. When the organic layer CF is a color filter layer, the color filter layer imparts colors to light passing through the liquid crystal layer. The color filter layer may include a red filter layer, a green filter layer and blue filter layer. The color filter layer may correspond to a unit pixel. Adjacent color filter layers may have different colors. The color filter layer may overlap an adjacent color filter layer in a boundary between adjacent unit pixels. Alternatively, the color filter layer may be spaced apart from an adjacent color filter layer at the boundary between adjacent unit pixels.

Figure 20:
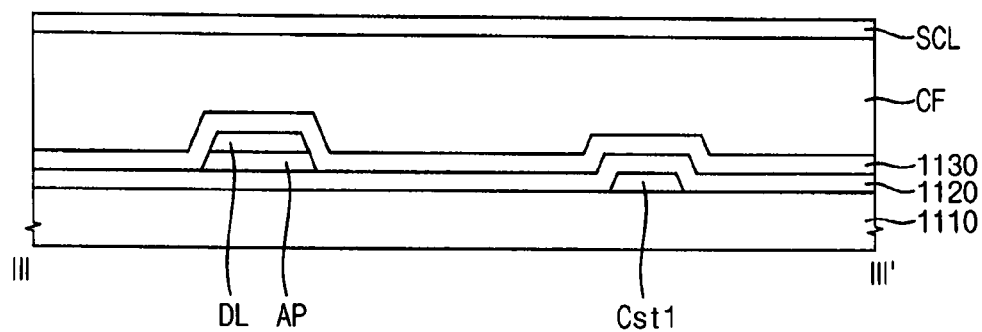

Referring to FIG. 20, a shielding electrode layer SCL is formed on the base substrate 1110 on which the organic layer CF is formed.

The shielding electrode layer SCL may include a transparent conductive material, such as indium tin oxide (ITO), indium zinc oxide (IZO), etc. In addition, the shielding electrode layer SCL may include titanium (Ti) and/or molybdenum titanium (MoTi).

Figure 21:
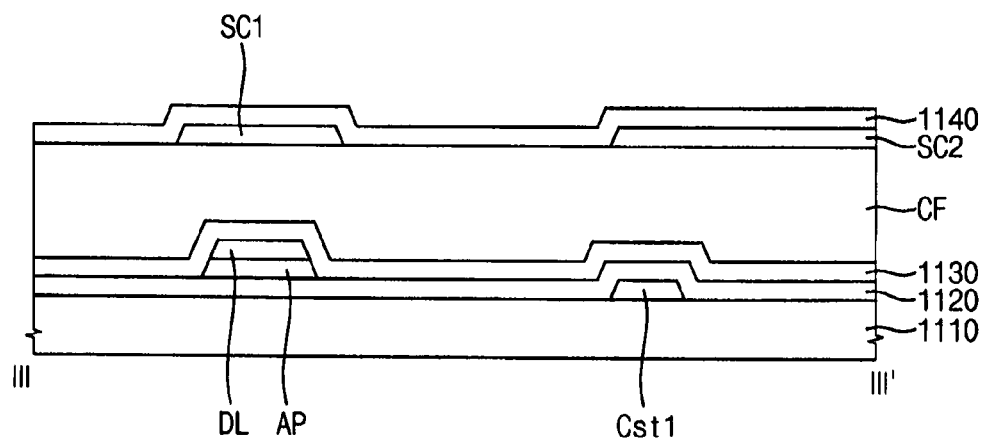

Referring to FIG. 21, the shielding electrode layer SCL may be patterned to form the shielding electrode SC. The shielding electrode SC may include a first portion SC1 and a second portion SC2.

The first portion SC1 of the shielding electrode SC may overlap the data line DL. The first portion SC1 may extend in the second direction D2. A width of the first portion SC1 may be wider than a width of the second portion SC2.

The second portion SC2 of the shielding electrode SC may overlap the gate line GL. The second portion SC2 may extend in the first direction D1. In addition, the second portion SC2 may entirely overlap a region between pixel electrodes adjacent to each other in the second direction D2.

The passivation layer 1140 is formed on the base substrate 1110 on which the shielding electrode SC is formed. The passivation layer 1140 may include an inorganic material such as silicon oxide (SiOx) and/or silicon nitride (SiNx). For example, the passivation layer 1140 may include silicon oxide (SiOx), and may have thickness of about 500 Å. In addition, the passivation layer 1140 may include a plurality of layers that include different materials.

Figure 22:
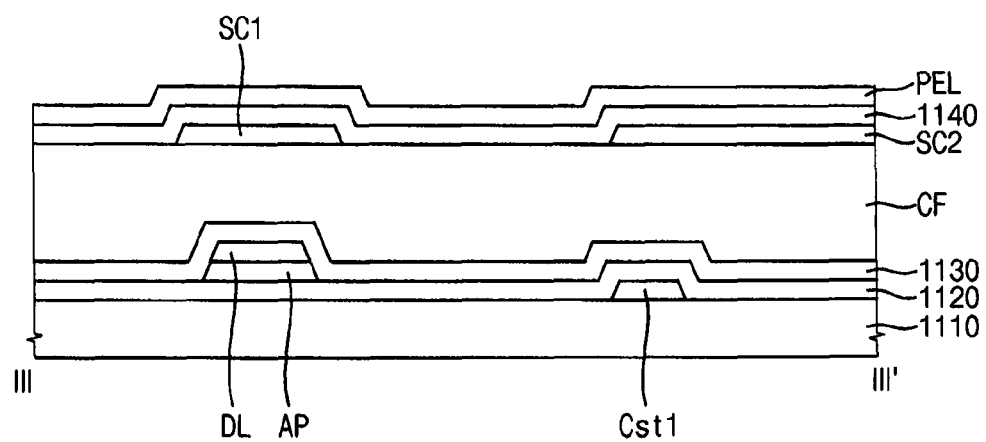

Referring to FIG. 22, a pixel electrode layer PEL is formed on the base substrate 1110 on which the passivation layer 1140 is formed.

The pixel electrode layer PEL may include a transparent conductive material, such as indium tin oxide (ITO), indium zinc oxide (IZO), etc. In addition, the pixel electrode layer PEL may include titanium (Ti) and/or molybdenum titanium (MoTi).

Referring to FIGS. 13 and 14, the pixel electrode layer PEL is patterned to form a pixel electrode PE. The pixel electrode PE may include a high-pixel electrode PE1 and a low-pixel electrode PE2. In addition, the first and second portions SC1, SC2 of the shielding electrode SC may each overlap an edge of the pixel electrode PE.

The high-pixel electrode PE1 is disposed adjacent to the gate line GL in the second direction D2, between the first data line DL1 and the second data line DL2. The high-pixel electrode PE1 is electrically connected to the first drain electrode DE1 of the first switching element SW1 through a first contact hole CNT1.

The low-pixel electrode PE2 is disposed opposite to the high-pixel electrode PE1 with respect to the gate line GL, between the first data line DL1 and the second data line DL2. The low-pixel electrode PE2 is electrically connected to the second drain electrode DE2 of the second switching element SW2 and the third drain electrode DE3 of the third switching element SW3 through a second contact hole CNT2.

A first voltage may be applied to the high-pixel electrode PE1. A different second voltage may be applied to the low-pixel electrode PE2. For example, the first voltage may be higher than the second voltage, the high-pixel electrode PE1 may be driven as a high pixel, and the low-pixel electrode PE2 may be driven as a low pixel.

According to a present exemplary embodiment, a shielding electrode is formed on an entire light-blocking region, so that a black matrix may be omitted in a display substrate according to a present exemplary embodiment. Therefore, a mask for forming the black matrix may be omitted, which may decrease a manufacturing cost.

The foregoing is illustrative of embodiments of the present inventive concept and is not to be construed as limiting thereof. Although a few exemplary embodiments of the present inventive concept have been described, those skilled in the art will readily appreciate that many modifications are possible in the exemplary embodiments without materially departing from the novel teachings of the present inventive concept. Accordingly, all such modifications are intended to be included within the scope embodiments of the present inventive concept as defined in the claims. The present inventive concept is defined by the following claims, with equivalents of the claims to be included therein, and modifications to the disclosed exemplary embodiments, as well as other exemplary embodiments, are intended to be included within the scope of the appended claims.

What is claimed is:

1. A display substrate comprising:
    a first switching element electrically connected to a gate line that extends in a first direction and a data line that extends in a second direction crossing the first direction;
    an insulation layer disposed on the first switching element;
    a shielding electrode disposed on the insulation layer; and
    a pixel electrode that partially overlaps the shielding electrode,
    wherein the shielding electrode comprises:
        a first portion that overlaps the data line and extends in the second direction; and
        a second portion that overlaps the gate line and extends in the first direction,
    wherein the pixel electrode comprises:
        a first sub-pixel electrode;

a second sub-pixel electrode disposed on the same layer as the shielding electrode and connected to the first switching element, and that overlaps an edge of the first sub-pixel electrode and an edge of the third sub-pixel electrode; and a third sub-pixel electrode that surrounds the first pixel electrode in a plan view.

2. The display substrate of claim 1, wherein the shielding electrode comprises a transparent conductive material.

3. The display substrate of claim 1, further comprising:
a first storage line disposed on the same layer as the gate line that extends in the first direction; and
a second storage line disposed on the same layer as the data line that extends in the second direction.

4. The display substrate of claim 3, further comprising:
a second switching element electrically connected to the gate line, the data line and the third sub-pixel electrode; and
a third switching element electrically connected to the third sub-pixel electrode and the second storage line, and
wherein the first switching element is electrically connected to the first sub-pixel electrode and the second sub-pixel electrode.

5. The display substrate of claim 4, wherein a source electrode and a drain electrode of the second switching element extend in the first direction, and
wherein an end portion of a drain electrode of the third switching element extends in the first direction.

6. A display substrate comprising:
a first switching element electrically connected to a gate line that extends in a first direction and a data line that extends in a second direction crossing the first direction;

an insulation layer disposed on the first switching element;
a shielding electrode disposed on the insulation layer; and
a pixel electrode that partially overlaps the shielding electrode,
wherein the pixel electrode comprises:
a first sub-pixel electrode;
a second sub-pixel electrode disposed on the same layer as the shielding electrode and connected to the first switching element, and
a third sub-pixel electrode that surrounds the first pixel electrode in a plan view.

7. The display substrate of claim 6, further comprising:
a first storage line disposed on the same layer as the gate line that extends in the first direction; and
a second storage line disposed on the same layer as the data line that extends in the second direction.

8. The display substrate of claim 7, wherein the first switching element includes a first drain electrode that includes an electrode portion that overlaps the gate line, and a contact portion that overlaps the first storage line, and
the first storage line includes a stem portion and a protruding portion that protrudes in the second direction to overlap the contact portion of the first drain electrode,
wherein the contact portion and the protruding portion have a substantially same area.

9. The display substrate of claim 6, wherein
the second sub-pixel electrode overlaps an edge of the first sub-pixel electrode and an edge of the third sub-pixel electrode, and the shielding electrode comprises:
a first portion that overlaps the data line and extends in the second direction; and
a second portion that overlaps the gate line and extends in the first direction.

* * * * *